United States Patent [19]

Beasom

[11] 3,722,079

[45] Mar. 27, 1973

[54] PROCESS FOR FORMING BURIED LAYERS TO REDUCE COLLECTOR RESISTANCE IN TOP CONTACT TRANSISTORS

[75] Inventor: James D. Beasom, Indian Harbor Beach, Fla.

[73] Assignee: Radiation Incorporated,, Melbourne, Fla.

[22] Filed: June 5, 1970

[21] Appl. No.: 43,789

[52] U.S. Cl. ........................29/578, 29/580, 148/187

[51] Int. Cl. ..............................................B01j 17/00

[58] Field of Search................29/578, 580, 576, 583; 148/187

[56] References Cited

UNITED STATES PATENTS

| | | | |
|---|---|---|---|
| 3,370,995 | 2/1968 | Lowery et al. | 29/580 UX |
| 3,381,182 | 4/1968 | Thornton | 317/234 |

*Primary Examiner*—Charles W. Lanham
*Assistant Examiner*—W. Tupman
*Attorney*—Donald R. Greene

[57] ABSTRACT

A buried layer in an integrated circuit structure is formed by one-step deposition (epitaxial or diffusion) of heavily doped silicon over the bottom surface of a wafer in which island-separating moats have been etched. The buried layer is thus uniformly provided both at the bottom and along the sides of the finished islands. In the formation of a transistor in the island, a collector contact diffusion layer is diffused through a mask aperture configured and spaced relative to the island center to assure intersection between this diffusion layer and buried layer. In addition the collector contact is deposited through another mask aperture spaced and configured relative to the island center to assure that the collector contact is in contact only with the portion of the collector contact diffusion layer residing within the island edges.

15 Claims, 8 Drawing Figures

INVENTOR
JAMES D. BEASOM

By Hurwitz & Rose

ATTORNEYS

INVENTOR
JAMES D. BEASOM

By Hurwitz & Rose
ATTORNEYS

PROCESS FOR FORMING BURIED LAYERS TO REDUCE COLLECTOR RESISTANCE IN TOP CONTACT TRANSISTORS

BACKGROUND OF THE INVENTION

The present invention relates to methods for providing low resistance connections between integrated circuit components, and more particularly to simple and inexpensive methods for depositing conductive buried layers and assuring electrical contact therewith at the integrated circuit structure surface.

A practical problem encountered in fabrication of integrated circuits concerns the provision of low-resistance electrical connections to underlying portions of the integrated circuit structure from the surface of the structure. For example, the collector saturation resistance of a transistor in an integrated circuit is higher than desired because of the inherent resistivity of the collector region combined with the relatively small surface area of the low-resistance collector contact. A prior art approach to reducing the collector saturation resistance in integrated circuits has been to include a low-resistance buried layer below and in contact with the collector region. Even this approach, as pointed out in U.S. Pat. No. 3,381,182 to Thornton, leaves room for improvement because the collector saturation resistance is still appreciable. Consequently, Thornton discloses a structure wherein the buried layer is surrounded by a further buried layer of molybdenum disilicide which extends along the sides of the collector region so as to be readily contacted from the surface of the wafer or chip. This provides a relatively wide area of contact between the collector contact and the buried layer and significantly reduces the collector saturation resistance.

The Thornton approach does have its problems, however. For example, the formation of the molybdenum disilicide layer is relatively complex. First the molybdenum metal must be deposited on the wafer or slice. Achieving a uniform coating of the metal on all sides of the component island is difficult at best; moreover, adherence between the dissimilar materials (molybdenum and silicon) is not easily effected. After the molybdenum is deposited its silicide must be formed. Finally an insulator capable of adhering to both the molybdenum disilicide polycrystalline silicon must then be deposited over the molybdenum disilicide. This multi-step process, with its inherent difficulties concerning adhesion and layer uniformity, leaves much to be desired.

Further, the Thornton approach does not take into consideration variations in the size of component islands, which variations are inherent in dielectric wafter fabrication. Thus the Thornton approach, as disclosed, cannot assure that the collector contact diffusion layer will intersect the buried low-resistance layer for all island sizes. Further, Thornton does not take steps to prevent the collector contact from making electrical contact with the polycrystalline silicon lying outside the component island; such contact could produce undesired short circuits between two or more component islands.

It is therefore one object of the present invention to provide a method for fabricating an improved integrated circuit structure wherein a uniform buried low-resistance layer is provided along the bottom and sides of a component island with one simple step.

It is another object of the present invention to provide a method for fabricating integrated circuit structures of the type having a buried conductive layer extending along the bottom and sides of a component island, wherein surface contact with the buried layer is assured and inadvertent short circuits between component islands are prevented.

It is still another object of the present invention to provide a method for manufacturing integrated circuits including transistors having very low collector saturation resistances.

It is yet another object of the present invention to provide a method for fabricating integrated circuit structures of the type wherein a buried low-resistance layer is provided to reduce the resistance between the surface of the structure and the region underlying the component island, and wherein contact with the buried layer at the surface without inadvertent short circuits with the surrounding silicon is assured.

It is another object of the present invention to provide a method for fabricating an integrated circuit structure in which a heavily doped buried layer of silicon is deposited at the bottom and sides of a component island by either unmasked high-concentration diffusion or epitaxial deposition.

SUMMARY OF THE INVENTION

In accordance with the principles of the present invention the bottom surface of a monocrystalline silicon wafer is etched to form one or more moats and a buried layer of heavily-doped silicon is deposited epitaxially, or by non-selective diffusion, over the etched surface so as to cover all surfaces of the moats. An isolation oxide layer is then formed on the buried layer, and a base structure of polycrystalline silicon is deposited on the isolation layer. The wafer is then backlapped to form a wafer structure in which component islands of monocrystalline silicon are surrounded by the buried layer, which in turn is surrounded by the isolation oxide layer to insulate the component island from the polycrystalline silicon base. Both the buried layer and the oxide layer intersect the top surface of the wafer.

Components are formed in the islands by conventional techniques, such as by forming an oxidation layer and then performing a photoresist-etch-diffusion cycle. In the case of a transistor collector (or any component for which contact with the buried layer is desired to minimize resistance) the collector contact diffusion aperture is made to extend from the island far enough to overlap the buried layer at the wafer surface for the largest possible island. In addition the collector contact aperture is positioned close enough to the island center so that it never overlaps the edge of the island, no matter how small the island. These steps are required because the size of the island, and hence the spacing of the buried layer from the island center at the wafer surface, can vary over a range which is large relative to the thickness of a typical buried layer. These variations in size are the result of process variations inherent in dielectric wafer fabrication. These steps thus assure that the collector contact diffusion layer intersects the buried layer at the island edge and that the collector contact does not abut the polycrystalline base where it would be short-circuited to contacts from other islands.

The significant features of the present invention, which permit of achieving the aforementioned objects, are therefore: (1) the formation of the buried layer by a single-step deposition of heavily-doped silicon such that the buried layer intersects the top surface of the finished wafer; (2) the formation of the collector contact diffusion layer in such a way as to assure its intersection with the buried layer at the top wafer surface; and (3) the disposition of the collector contact such that it cannot contact the polycrystalline base structure. These features, taken separately and in combination, provide a novel, inexpensive, expeditious method of fabricating low saturation resistance collectors in integrated circuit structures.

BRIEF DESCRIPTION OF THE DRAWINGS

The above and still further objects, features and advantages of the present invention will become apparent upon consideration of the following detailed description of one specific embodiment thereof, especially when taken in conjunction with the accompanying drawings, wherein.

DESCRIPTION OF THE PREFERRED EMBODIMENT

Figures 1, 2, 3, 4, 5:
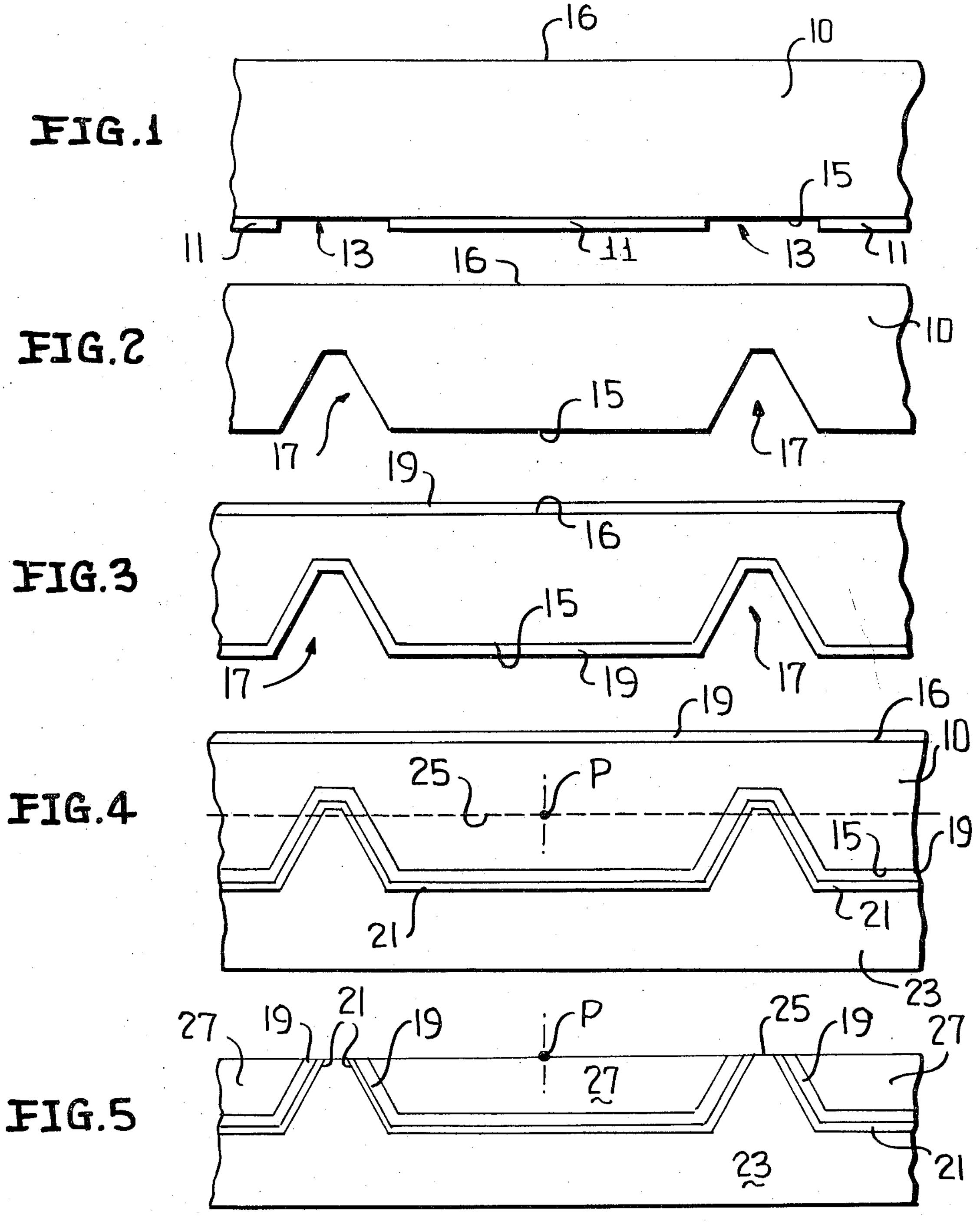
FIGS. 1, 2, 3, 4 and 5 are sectional plan views of an integrated circuit structure after respective successive stages of the fabrication process of the present invention.

Referring now specifically to FIG. 1 of the accompanying drawing there is illustrated an N-type monocrystalline silicon starting wafer 10 having a bottom surface 15, a top surface 16, and a resistivity on the order of 4 ohm-cm. A masking oxide of silicon is grown on bottom surface 15 of wafer 10 and then selectively etched away in regions 13 to form isolated areas 11 of the oxide. Each oxide area 11 corresponds to a respective region in wafer 10 which is to contain circuit components.

An etchant which attacks silicon but not its oxide is then applied to wafer surface 15 to form moats 17 in wafer 10 as illustrated in FIG. 2. Each moat surrounds a respective oxide island 11 to define an interior region which is to contain circuit components. The moats may be narrow or wide, as desired, according to the sizes of etched regions 13 in FIG. 1. The oxide areas 11 are then removed (as by etching, or the like) resulting in the structure illustrated in FIG. 2.

A heavily-doped layer 19 of N+ type silicon is then deposited on bottom surface 15 of wafer 10. As illustrated in FIG. 3, layer 19 can be formed by a conventional non-selective (i.e. — unmasked) high concentration diffusion step using, for example, arsenic or antimony as the impurity. When so deposited, layer 19 is formed on both the bottom surface 15 and top surface 16 of wafer 10. Alternatively, layer 19 could be formed on surface 15 only by epitaxial deposition of N+ silicon. Layer 19, as will be seen from the following description, serves as the low-resistance buried layer. Importantly, it is to be noted that a single step (i.e., — non-selective diffusion or epitaxial deposition) is all that is necessary to form buried layer 19 uniformly along the sides of moats 17 and the bottom surface 15 of wafer 10. Buried layer 19 is typically on the order of 0.1 mil thick and has a typical resistance on the order of 0.005 ohm-cm.

Referring now to FIG. 4, an isolation oxide (typically silicon dioxide) is grown over buried layer 19 at the bottom of wafer 10. Layer 21 may be grown by thermal oxidation of part of buried layer 19 or by depositing a thin layer of polycrystalline silicon over layer 19 and then thermally oxidizing the newly deposited layer. Isolation oxide layer 21 has a thickness which is typically on the order of or slightly smaller than that of buried layer 19. A support or base structure 23 of polycrystalline silicon is then grown over the isolation oxide layer 21 to any desired thickness.

After support layer 23 is formed, wafer 10 is backlapped to remove all material above dotted line 25. The latter extends transversely through wafer 10 at any desired depth, provided of course that it lies below the uppermost reaches of buried layer 19 and intersects the latter at the sides of the moats. The resulting structure is illustrated in FIG. 5 wherein it is seen that a plurality of component islands 27 are formed in the polycrystalline base structure 23, each island being defined by a buried layer 19 which extends to and intersects top surface 25 of the overall structure. The isolation oxide layer 19 for each island also intersects surface 25 and electrically isolates that island from the polycrystalline base and hence from other component islands.

Figure 6:
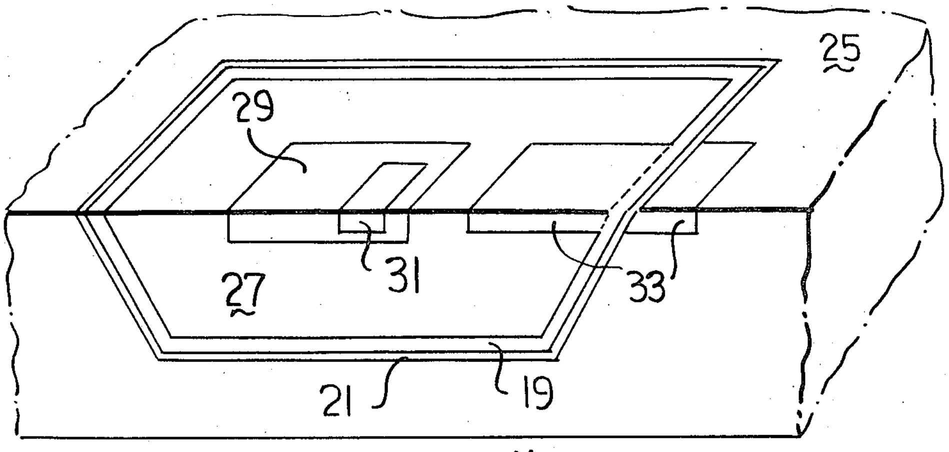
FIG. 6 is a sectional view in perspective of a transistor fabricated by the process steps illustrated in FIGS. 1–5.

After the structure of FIG. 5 is completed, components are formed in the various islands 27 in the usual fashion. For example, if a transistor is to be formed, the monocrystalline silicon within islands 27 would serve as the collector. The slice may then be oxidized at surface 25, and a photoresist-etch-diffusion cycle may be performed to form the base 29 of the transistor, as illustrated in FIG. 6. Next a photoresist etch-diffusion cycle may be performed to form the emitter 31 and the collector contact diffusion layer 33. The latter serves primarily to provide a suitable surface on which the collector contact may be deposited. The formation of layer 33 is an important feature of the present invention and is described in detail below; at this point, however, it is sufficient to state that layer 33 may be diffused simultaneously with emitter 31. After formation of the emitter 31 and collector contact diffusion layer 33 and an aperture photoresist-etch sequence may be performed in a conventional manner to provide contact windows to base 29, emitter 31 and collector contact diffusion layer 33. Finally, an aluminum evaporation-photoresist-etch sequence may be performed to form the electrode and circuit interconnection pattern.

Apart from the improvements in simplifying formation of buried layer 19, the present invention is also concerned with providing a fabrication method which assures that collector contact diffusion aperture 33 intersects buried layer 19 at surface 25 for all possible size variations in island 27. In addition, the present invention is concerned with assuring that the collector contact itself can never come into contact with the polycrystalline silicon support 23 and thereby short to other contacts. In this regard, and reference is now made to FIGS. 4 and 5 of the accompanying drawings, it is to be noted that each island 27 has a center point P which is equidistant from opposite edges of that island. No matter which level is chosen for surface plane 25 of FIGS. 4 and 5, center point P remains fixed; only the distance between P and opposite island edges changes with the depth of surface plane 25. Consequently, center point P for each island 27 serves as a fixed spatial reference for that island relative to one or more edges of the overall wafer or integrated circuit structure. Thus, in forming mask apertures for each island, the apertures may be spaced and sized with reference to center point P.

Figure 7:
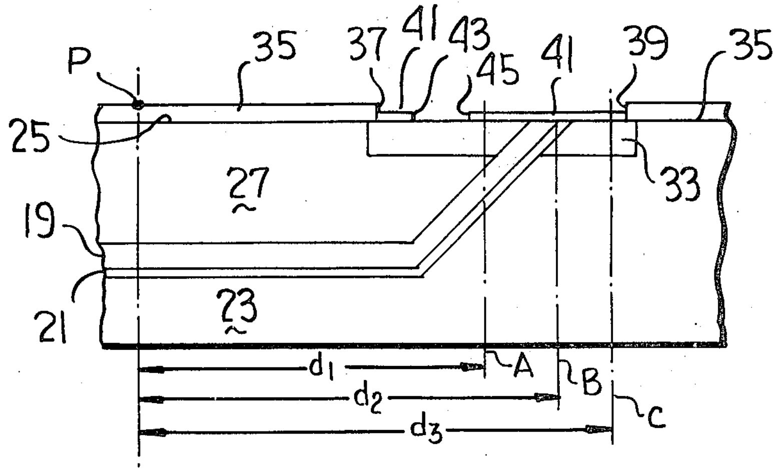
FIG. 7 is a partial sectional plan view of the transistor of FIG. 6 illustrating the location of the masking apertures of the collector contact diffusion layer and the collector contact.

Now, depending upon the choice of depth for surface plane 25, each island 27 will vary in size between predetermined limits. This size variation is large relative to the thickness of buried layer 19. Referring to FIG. 7 there are illustrated three reference lines A, B and C representing, respectively, the location of the edge of island 27 for the minimum possible island size, the location of the edge of island 27 for the actual island size, and the location of the edge of island 27 for the maximum possible island size. It is noted that the edge of island 27 is defined as the outer edge of buried layer 19 at surface 25. In forming the collector contact diffusion layer 33, it is crucial to assure that this layer contacts buried layer 19 for all island sizes. To this end, there is illustrated in FIG. 7 an oxide mask 35 formed on surface 25 and having an aperture therein through which layer 33 may be diffused. This aperture has one edge 37, closest to point P, spaced from point P by a distance less than $d_1$ which is the distance between point P and line A. Another edge 39 of the aperture in mask 35 is spaced from point P by a distance in excess of $d_3$, the distance between point P and line C. Upon diffusion of the collector contact diffusion layer 33 through the aperture between edges 37 and 39 of mask 35, contact between buried layer 19 and layer 33 at surface 25 is assured. This is true because the mask aperture for layer 33 has been selected to overlap the island edge for both minimum and maximum island sizes.

In the formation of the collector contact at the top surface of layer 33, it is crucial the collector contact be electrically isolated from the polycrystalline support 23 and the portion of layer 33 lying outside the island. To this end an N+ masking oxide 41 is provided having an aperture therein defined between inner and outer edges 43 and 45, respectively. Both edges 43 and 45 are spaced from point P by a distance which is less than $d_1$, assuring that this aperture cannot overlap the island edge for even the smallest island size. The collector contact to be formed on layer 33 in the aperture in mask 41 is in contact only with the surface of layer 33 lying inside the island. If edges 43 and 45 are spaced from point P by a distance in excess of the spacing between edge 37 and point P (as illustrated), assurance is had that the collector contact will be in electrical contact solely with layer 33.

It is important to note that isolation oxide layer 21 serves to insulate from one another the portions of layer 33 lying inside and outside the island. It is also important to note that the afore-described method prevents the polycrystalline support material 23 from existing inside the minimum size island (line A), and that the collector contact aperture in mask 41 always resides inside the minimum size island, so that the collector contact and polycrystalline silicon cannot contact one another.

Figure 8:
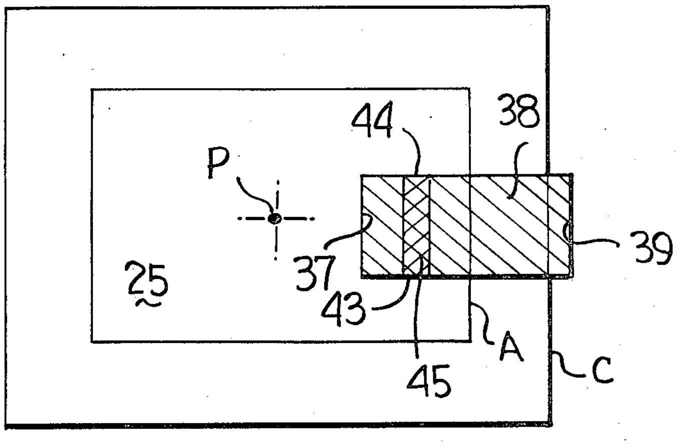
FIG. 8 is a diagrammatic top view of a typical transistor formed by the process of the present invention, illustrating how the collector contact is assured of electrical contact with the buried layer without shorting to other contacts.

Referring to FIG. 8, a top diagrammatic view of the structure illustrates a rectangular island of minimum size A and maximum size C having fixed center point P. The spacing relative to P of mask edges 37 and 39 to define aperture 38 for collector contact diffusion layer 33 is clearly illustrated. Again it is noted that layer 33 must intersect the island edge at surface 25 for all variations of island size between A and C. Likewise the spacing relative to P of mask edges 43 and 45 to form aperture 44 for the collector contact is clearly illustrated. Again it is noted that the collector contact must reside entirely within the island for even the smallest island size A.

Some of the advantages of the process described above may be enumerated as follows: (1) the buried layer may be formed in a single step by techniques well known in integrated circuit fabrication; (2) fewer steps are required to fabricated integrated circuit transistors with reduced collector saturation resistance than are required in the aforementioned Thornton patent; (3) side diffusion of the collector contact diffusion layer 33 is not necessary to assure intersection with the buried layer, and therefore closer island spacings are possible; (4) the wafer need not be subjected to long high-temperature exposure to achieve collector saturation resistance reduction; (5) true contact between the collector contact diffusion and buried layer is assured; and (6) accidental shorting between the collector contact and polycrystalline silicon is eliminated. It is to be noted that advantages (5) and (6) accrue without the necessity of developing a different mask pattern for each variation in island size.

While I have described and illustrated one specific embodiment of my invention, it will be clear that variations of the details of construction which are specifically illustrated and described may be resorted to without departing from the true spirit and scope of the invention as defined in the appended claims.

I claim:

1. A process for forming a low resistance electrical contact with a portion of the single crystal semiconductor material of each of a plurality of single crystal semiconductor islands dielectrically isolated from a polycrystalline semiconductor substrate by a respective layer of dielectric material, which comprises:

providing each of said islands with a low resistivity border of single crystal semiconductor material in a layer immediately adjacent the dielectric isolation layer, said low resistivity being relative to the resistivity of that portion of the island with which low resistance contact is to be made and said border layer material being of the same conductivity type as said portion, forming at the surface of each of said islands a restricted region of low resistivity single crystal semiconductor material of said same conductivity type over an area extending from within an edge of the island for the minimum surface boundary to at least said edge of the island for the maximum surface boundary which the island may occupy consistent with predetermined allowable limits of island size attributable to island fabrication tolerances, so that said low resistivity restricted region intersects said low resistivity border layer of the respective island at said surface regardless of the extent of the island surface boundaries within said predetermined limits, and applying a conductive layer to a limited area of said low resistivity restricted region within the minimum surface boundary of each of said islands as a contact region between said portion of the island and circuit components to be located external to the respective island.

2. The process according to claim 1, further including forming a circuit component within each of at least some of said islands.

3. The process according to claim 2, wherein at least one said circuit component is a transistor, and said portion of the island with which low resistance contact is to be made is the collector region of said transistor.

4. The process according to claim 1, wherein said island surface boundaries vary even as between islands of nominally the same desired size.

5. The process according to claim 1, wherein said low resistivity restrictive region bounds both sides of said dielectric isolation layer of at least some of said islands as a consequence of the respective island having been fabricated with a surface boundary less than said maximum boundary.

6. The process according to claim 1, wherein said dielectric isolation layer divides said low resistivity restricted regions of at least some of said islands, so that no direct electrical continuity exists between the portions of the restricted region within and outside of the boundary of any given island.

7. The process according to claim 1, wherein said semiconductor material is silicon, and said dielectric isolation layer is silicon dioxide.

8. The process according to claim 7, wherein said silicon dioxide layer is thinner than said border layer.

9. The process according to claim 8, wherein said portion of each single crystal island to which said low resistance contact is to be made and each of said border layers and said restricted regions is of N type conductivity.

10. In a process for fabricating integrated circuits in a plurality of single crystal semiconductor islands embedded in and sharing a planar surface of a substrate, said islands electrically isolated from one another and from said substrate by a dielectric layer, and wherein the size of the islands at said surface may vary within predetermined maximum and minimum limits as a consequence of allowable production variations, the steps of:

providing in at least some of said islands a layer of low resistivity single crystal semiconductor material in proximity to the dielectric layer for the respective island, said low resistivity layer extending from the bottom of said island to said surface, and forming at said surface of each of said islands in which said low resistivity layer is provided a restricted region of low resistivity single crystal semiconductor material extending over an area including said maximum and minimum limits for one edge of the respective island, to intersect the respective low resistivity layer regardless of variation of island surface size between said limits.

11. The process according to claim 10, further including forming a conductive layer atop an area of said low resistivity restricted region wholly within the minimum limit of extent of said edge of each of the respective islands.

12. The process according to claim 11, wherein:

said dielectric layer divides the low resistivity restricted region associated with at least some of said islands into first and second electrically isolated portions to preclude electrical continuity between the portion within the actual boundary and the portion outside the actual boundary of an island whose boundary is inside said maximum limit.

13. A process for producing low resistance contact with a preselected region of a single crystal semiconductor island electrically isolated from other islands within a substrate but sharing a common planar surface therewith, and wherein the size of the islands at said surface may vary within predetermined maximum and minimum limits as a consequence of allowable production variations, which comprises:

forming in each said island which is to have said low resistance contact a buried layer of low resistivity single crystal semiconductor material penetrating the island from the surface thereof to that preselected region with which low resistance contact is to be established, and establishing at the surface simultaneously for each of at least a plurality of islands having said buried layer a further layer of low resistivity single crystal semiconductor material intersecting the respective buried layer, each said further layer occupying an area of the surface associated with a respective island sufficiently large to intersect the respective buried layer despite said island-to-island variations in the location of the buried layer at the surface and sufficiently small to preclude conductive contact with the further layer respectively associated with any adjacent island.

14. The process according to claim 13, further including applying to each said further layer a conductive layer for electrical contact therewith and therefore with said preselected region to which said buried layer penetrates, said conductive layer restricted to overlie an area of said further layer wholly within the minimum allowable distance between the center of the island and the respective buried layer at the surface of that island.

15. The method of fabricating an integrated circuit structure of the type wherein a low-resistance buried layer underlies one or more isolated component-containing islands, said method including the steps of:

etching V-groove moats in a planar surface of a single crystal semiconductor wafer to designate the locations of said islands, forming at said surface and the surfaces of said moats a thin layer of single crystal semiconductor material of lower resistivity than the original semiconductor wafer, to constitute said buried layer, growing a dielectric isolation layer over said buried layer, depositing polycrystalline semiconductor material on said isolation layer to fill said moats and cover said surface, lapping back the opposite surface of said wafer to a planar surface to expose said polycrystalline semiconductor material in said moats surrounding the dielectric isolation layer bounding the respective islands, said islands thereby having dimensions at said planar surface at which they are exposed which vary between predetermined allowable maximum and minimum limits depending upon the extent of the actual backlapping of said opposite surface of said wafer, diffusing impurities through a mask aperture associated with each island and configured to form a contact diffusion layer which extends from a point on the island surface within the minimum allowable surface boundary to a point outside the maximum allowable surface boundary of each respective island, irrespective of the actual island boundary, so that the contact diffusion layer of any given island is assured of contacting the buried layer of that island regardless of possible variations in the island surface size from a predetermined nominal size, some of said islands thereby having an associated contact diffusion layer which is split by the dielectric isolation layer into a segment within the actual island boundary and contacting the buried layer and a segment outside the island boundary and isolated therefrom, and depositing a conductive contact layer atop said contact diffusion layer through a further mask aperture associated with each island having a contact diffusion layer, wherein said further mask aperture is positioned and configured to form said contact layer entirely on the portion of said contact diffusion layer within said minimum allowable surface boundary of the respective island.

* * * * *